(12) United States Patent
Kondo et al.

(10) Patent No.: US 10,592,299 B2
(45) Date of Patent: Mar. 17, 2020

(54) COMPUTATION NODE DEVICE, PARALLEL COMPUTER SYSTEM, AND CONTROL METHOD FOR COMPUTATION NODE DEVICE

(71) Applicant: FUJITSU LIMITED, Kawasaki-shi, Kanagawa (JP)

(72) Inventors: Yuji Kondo, Kawasaki (JP); Shinya Hiramoto, Yokohama (JP); Yuichiro Ajima, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 66 days.

(21) Appl. No.: 16/055,828

(22) Filed: Aug. 6, 2018

(65) Prior Publication Data
US 2019/0073247 A1 Mar. 7, 2019

(30) Foreign Application Priority Data
Sep. 6, 2017 (JP) .................. 2017-171480

(51) Int. Cl.
  *H03M 13/00* (2006.01)
  *G06F 9/52* (2006.01)
  *H03M 13/09* (2006.01)
  *H04L 1/00* (2006.01)

(52) U.S. Cl.
  CPC ............ *G06F 9/522* (2013.01); *H03M 13/09* (2013.01); *H03M 13/091* (2013.01); *H04L 1/0052* (2013.01); *H04L 1/0061* (2013.01)

(58) Field of Classification Search
  CPC ..... G06F 9/522; H03M 13/09; H03M 13/091; H04L 1/0052
  See application file for complete search history.

(56) References Cited

U.S. PATENT DOCUMENTS

| | | | |
|---|---|---|---|
| 6,587,985 B1* | 7/2003 | Fukushima | ........... H04L 1/1642 714/748 |
| 7,428,690 B2* | 9/2008 | Arita | ....................... H04L 49/90 714/766 |
| 7,827,030 B2* | 11/2010 | Smith | ................... G10L 19/005 704/228 |
| 7,831,882 B2* | 11/2010 | Tsern | .................. G06F 11/1008 714/751 |
| 7,913,150 B2* | 3/2011 | Miranda | ............. H03M 13/091 714/718 |

(Continued)

FOREIGN PATENT DOCUMENTS

| | | |
|---|---|---|
| JP | 2010-122848 | 6/2010 |
| JP | 2013-513269 | 4/2013 |
| WO | WO 2011/067381 A1 | 6/2011 |

*Primary Examiner* — Esaw T Abraham
(74) *Attorney, Agent, or Firm* — Staas & Halsey LLP

(57) ABSTRACT

A computation node device includes a buffer configured to store first data, a receiver configured to receive a packet including second data, an error check circuit configured to perform an error check of the packet and output a check result, and an operation device configured to perform, before receiving the check result output from the error check circuit, a reduction operation by using the first data stored in the buffer and the second data included in the packet and output an operation result of the reduction operation when the check result output from the error check circuit indicates non-existence of an error in the packet.

9 Claims, 9 Drawing Sheets

(56) References Cited

U.S. PATENT DOCUMENTS

| | | | |
|---|---|---|---|
| 8,238,460 B2* | 8/2012 | Tong | H04L 1/0643 375/260 |
| 8,462,653 B2* | 6/2013 | Medvedev | H04L 1/0002 370/236 |
| 8,824,606 B2* | 9/2014 | Cheng | H04L 27/0014 329/308 |
| 9,860,399 B2* | 1/2018 | Nishimura | G06F 3/1207 |
| 2010/0124241 A1 | 5/2010 | Hiramoto et al. | |
| 2011/0161777 A1 | 6/2011 | Radulescu | |

* cited by examiner

FIG. 2

| | NODE1 | NODE2 | NODE3 | NODE4 | SUM |
|---|---|---|---|---|---|
| | V1 | V2 | V3 | V4 | |
| ELEMENT1 | 1 | 7 | 13 | 19 | 40 |
| ELEMENT2 | 2 | 8 | 14 | 20 | 42 |
| ELEMENT3 | 3 | 9 | 15 | 21 | 48 |
| ELEMENT4 | 4 | 10 | 16 | 22 | 52 |
| ELEMENT5 | 5 | 11 | 17 | 23 | 56 |
| ELEMENT6 | 6 | 12 | 18 | 24 | 60 |
| ELEMENT7 | 7 | 13 | 19 | 25 | 64 |
| ELEMENT8 | 8 | 14 | 20 | 26 | 68 |

| ROUTING HEADER | |   |
|---|---|---|
| CONTROL INFORMATION | | |
| DATA1 | DATA2 | |
| DATA3 | DATA4 | |
| DATA5 | DATA6 | |
| DATA7 | DATA8 | |
| CHECK SUM | | F |

FIG. 3

| Cycle | INPUT (RECEIVED PACKET) | INPUT (PREVIOUSLY ARRIVED DATA) | OPERATION DEVICE OUTPUT | OUTPUT DATA |
|---|---|---|---|---|
| 0 | ROUTING HEADER | | | |
| 1 | CONTROL INFORMATION | | | |
| 2 | Data1 /2 | Data1' /2' | | |
| 3 | Data3 /4 | Data3' /4' | Data 1'' | |
| 4 | Data5 /6 | Data5' /6' | Data 2'' | |
| 5 | Data7 /8 | Data7' /8' | Data 3'' | |
| 6 | F | | Data 4'' | |
| 7 | | | Data 5'' | CONTROL INFORMATION |
| 8 | | | Data 6'' | Data1''/2'' |
| 9 | | | Data 7'' | Data3''/4'' |
| 10 | | | Data 8'' | Data5''/6'' |
| 11 | | | | Data7''/8'' |

COMPUTATION NODE DEVICE, PARALLEL COMPUTER SYSTEM, AND CONTROL METHOD FOR COMPUTATION NODE DEVICE

CROSS-REFERENCE TO RELATED APPLICATION

This application is based upon and claims the benefit of priority of the prior Japanese Patent Application No. 2017-171480, filed on Sep. 6, 2017, the entire contents of which are incorporated herein by reference.

FIELD

The embodiments discussed herein are related to a computation node device, a parallel computer system, and a control method for a computation node device.

BACKGROUND

A large-scale computation, such as a scientific computation, that uses a computer system sometimes involves a parallel computation through the use of a plurality of computers. A computer system that can perform a parallel computation is known as a parallel computer. Each of a plurality of computers that perform parallel computations is called a computation node device.

A reduction operation, which treats data belonging to a plurality of processes, is performed between a plurality of computation node devices that are performing parallel computations. Examples of a reduction operation include an operation of obtaining the sum of data, an operation of obtaining the maximum and minimum values of data, and others.

A barrier synchronization device is known, in which the provision of a synchronization unit that synchronizes a plurality of sets of signals accelerates the barrier synchronization for a plurality of nodes that perform parallel operations (see for example Japanese Laid-open Patent Publication No. 2010-122848).

A technique is also known, in which an intermediate node transfers a cut-through data packet, enabling the transmission of the cut-through data packet to start before performing a frame CRC on the packet (see for example Japanese National Publication of International Patent Application No. 2013-513269).

A reduction operation performed in a computation node device involves a process in which that computation node device receives a packet from a different computation node device, performs an error check on the packet by using the checksum included in the packet, and performs the reduction operation by using the data in the packet when finding no error.

An error check is difficult for a computation node device to perform before completely receiving a packet up to the end of the packet. A packet larger in size leads to a longer time between the start and the completion of the reception of the packet, which also elongates the time before the completion of the error check. As described above, a reduction operation is performed after the completion of the error check. Thus, a packet larger in size elongates a waiting time between the start of the reception of the packet and the start of the reduction operation.

SUMMARY

According to an aspect of the invention, a computation node device of the embodiment includes a buffer, a receiver, an error check circuit, and an operation device.

The buffer stores first data.

The receiver receives a packet including second data.

The error check circuit performs an error check of the packet and outputs a check result.

The operation device performs, before receiving the check result output from the error check circuit, an operation by using the first data stored in the buffer and the second data included in the packet. The operation device outputs an operation result of the performed operation when the check result indicates non-existence of an error in the packet.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 2 illustrates an example of a reduction operation;

FIG. 3 illustrates a format of a packet;

FIG. 9 illustrates a time chart of input and output for a reduction operation device according to an embodiment.

DESCRIPTION OF EMBODIMENTS

Figure 1:
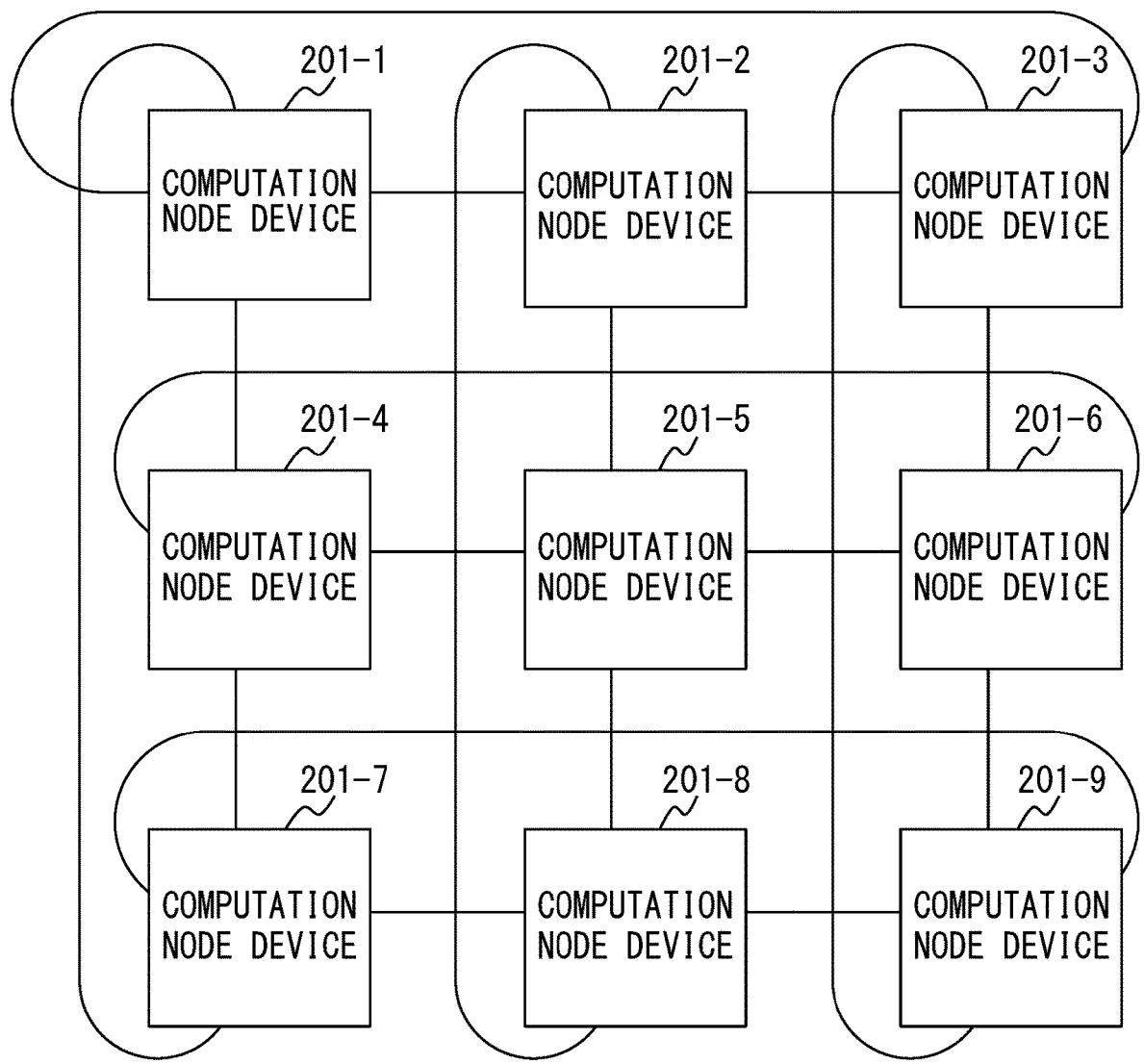
FIG. 1 illustrates a configuration of a parallel computer system according to an embodiment.

Hereinafter, explanations will be given for the embodiments by referring to the drawings.

FIG. 1 illustrates a configuration of the parallel computer system according to the embodiment.

A parallel computer system 101 includes computation node devices 201-$i$ ($i$=1 through 9).

The computation node devices 201-$i$ are computers that perform parallel computations. A computation node device 201-$i$ may be referred to also as node i. The computation node devices 201-$i$ are connected to adjacent computation node devices 201-$i$ through transmission paths, and can communicate with others. Each of the computation node devices 201-$i$ is connected to four other computation node devices 201-$i$.

The computation node device 201-1 is connected to the computation node devices 201-2, 201-3, 201-4, and 201-7. The computation node device 201-2 is connected to the computation node devices 201-1, 201-3, 201-5, and 201-8. The computation node device 201-3 is connected to the computation node devices 201-1, 201-2, 201-6, and 201-9. The computation node device 201-4 is connected to the computation node devices 201-1, 201-5, 201-6, and 201-7. The computation node device 201-5 is connected to the computation node devices 201-2, 201-4, 201-6, and 201-8. The computation node device 201-6 is connected to the computation node devices 201-3, 201-4, 201-5, and 201-9. The computation node device 201-7 is connected to the computation node devices 201-1, 201-4, 201-8, and 201-9. The computation node device 201-8 is connected to the computation node devices 201-2, 201-5, 201-7, and 201-9. The computation node device 201-9 is connected to the computation node devices 201-3, 201-6, 201-7, and 201-8.

The computation node devices 201-*i* receive packets from connected computation node devices 201-*i* and perform reduction operations.

Note that the number and the connection configuration (topology) of the computation node devices 201-*i* are exemplary, and the embodiments are not limited to them.

FIG. 2 illustrates an example of a reduction operation.

FIG. 2 illustrates examples of SUM, which is a result of adding together vectors V1 through V4 respectively of nodes 1 through 4.

Vectors V1 through V4 each have eight elements. V1=(1, 2, 3, 4, 5, 6, 7), V2=(7, 8, 9, 10, 11, 12, 13, 14), V3=(13, 14, 15, 16, 17, 18, 19, 20), and V4=(19, 20, 21, 22, 23, 24, 25, 26).

Adding vector V1 through V4 together results in SUM= (40, 44, 48, 52, 56, 60, 64, 68). As illustrated in FIG. 2, a reduction operation has reduced vectors V1 through V4 to one vector.

FIG. 3 illustrates a format of a packet.

A packet includes a routing header, control information, data k (k=1 through 8), a checksum, and a flag (F). The packet includes the routing header, the control information, data k, the checksum, and the flag in this order starting from the top.

The routing header contains destination information representing the destination of the packet.

The control information represents the type of the packet such as a packet used for a reduction operation, a read packet, a write packet, etc.

Data k is the payload, and is for example data used for a reduction operation. For example, data 1 through data 8 respectively correspond to element 1 through element 8 in FIG. 2.

The checksum is an error-detecting code, and is a value used for the error check of the packet. An example of the checksum is a Frame Check Sequence (FCS).

The flag is information representing the check result of an error check on the packet, thereby representing whether or not the packet is invalid. When an error is detected in the packet, the flag represents "error existing", i.e., the invalidity of the packet. When no error is detected in the packet, the flag represents "no error existing", i.e., the validity of the packet.

Note that the packet format illustrated in FIG. 3 is exemplary, and the embodiments are not limited to this.

Figure 4:
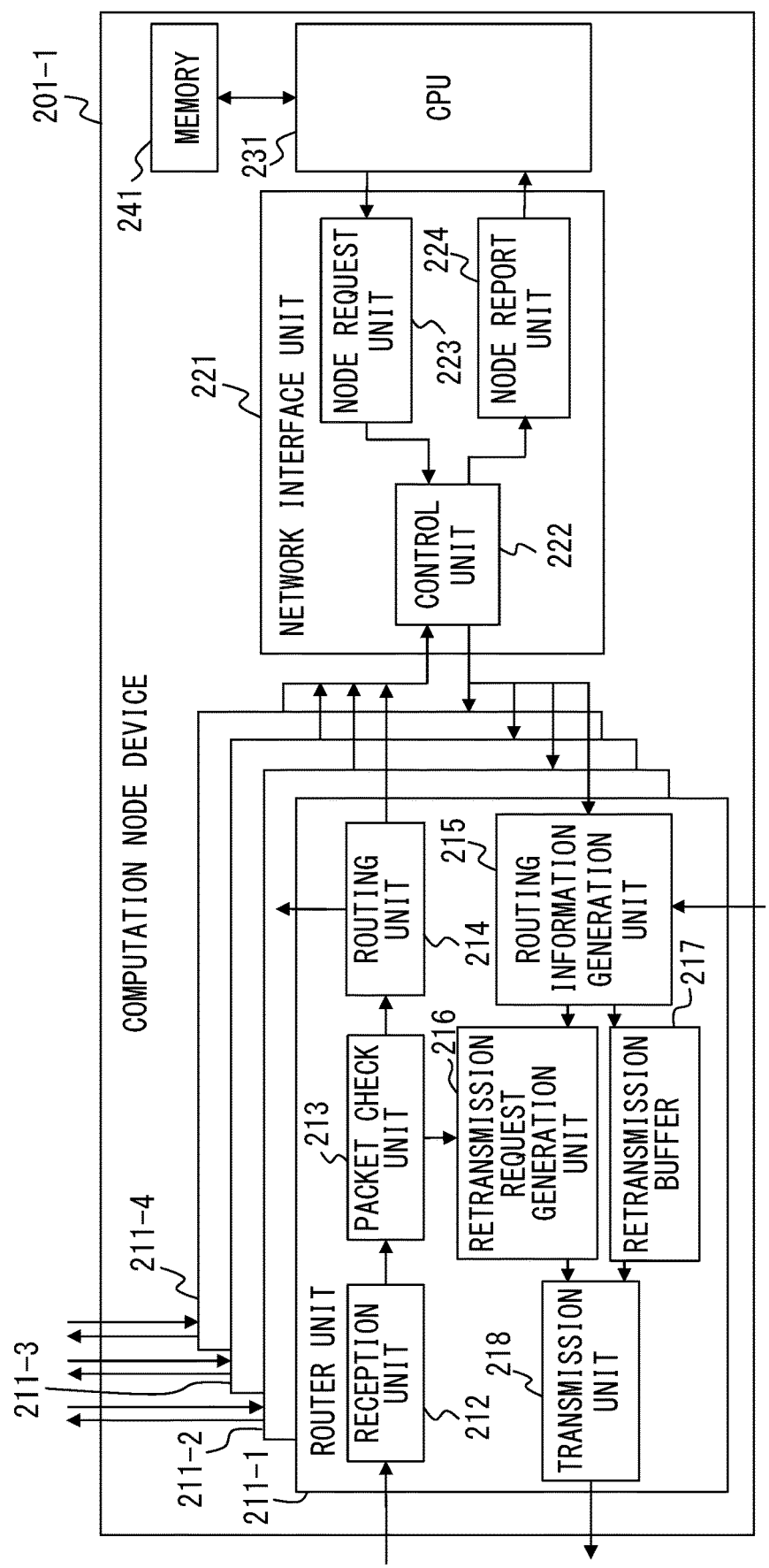
FIG. 4 illustrates a configuration of a computation node device according to an embodiment.

FIG. 4 illustrates a configuration of the computation node device according to the embodiment.

The computation node device 201-1 includes router units 211-*j* (j=1 through 4), a network interface unit 221, a Central Processing Unit (CPU) 231, and a memory 241.

The router units 211-1 through 211-4 are respectively connected to and communicate with the computation node devices 201-2, 201-3, 201-4, and 201-7, which are adjacent to the computation node device 201-1. The router units 211-1 through 211-4 are connected to and can communicate with the others. The router unit 211-*j* can be implemented by for example a hardware circuit such as an LS, etc.

The router unit 211-1 includes a reception unit 212, a packet check unit 213, a routing unit 214, a routing information generation unit 215, a retransmission request generation unit 216, a retransmission buffer 217, and a transmission unit 218.

The reception unit 212 receives a packet from the computation node device 201-2. The reception unit 212 is an example of a receiver.

The packet check unit 213 uses the checksum included in the received packet to perform an error check on the packet. The packet check unit 213 describes the check result to the flag of the packet, and outputs the packet to a control unit 222 via the routing unit 214. The check result of an error check is thus transmitted as the flag at the tail of a packet. The check result represents "error existing" when an error is detected in the packet, and represents "no error existing" when no error is detected in the packet. The packet check unit 213 performs an error check on a packet while receiving the packet, and at the same time outputs the already-received portion of the packet to the routing unit 214. Note that the packet check unit 213 does not have to output the checksum included in the packet to the routing unit 214. When an error is detected in the packet, the packet check unit 213 also outputs the check result to the retransmission request generation unit 216. The packet check unit 213 is an example of an error check circuit.

On the basis of the routing header included in a packet, the routing unit 214 outputs, to the control unit 222 or the router units 211-2 through 211-4, an already-received portion of the packet while receiving the packet through a cut-through method.

The routing information generation unit 215 updates the routing headers of packets received from the control unit 222 or the router units 211-2 through 211-4.

When receiving a check result representing "error existing", the retransmission request generation unit 216 transmits a retransmission request for the packet to the transmission source of that packet.

The retransmission buffer 217 stores a transmitted packet, and when receiving a retransmission request for that packet from the computation node devices 201-2 through 201-9, the packet in the retransmission buffer 217 is retransmitted.

The transmission unit 218 outputs the packet to the computation node device 201-2.

The router units 211-2 through 211-4 have a configuration similar to that of the router unit 211-1, and thus will not be explained.

The network interface unit 221 includes the control unit 222, a node request unit 223, and a node report unit 224. The network interface unit 221 can be implemented by for example a hardware circuit such as an LSI (Large Scale Integrated circuit) etc.

The control unit 222 performs a reduction operation by using the data in the received packet. The control unit 222 outputs the received packet to the CPU 231 via the node report unit 224. The control unit 222 outputs a request made by the CPU 231 to the router unit 211-*j*, the request being received from the node request unit 223.

The node request unit 223 outputs the request made by the CPU 231 to the control unit 222.

The node report unit 224 outputs the received packet to the CPU 231.

The CPU 231 performs various types of operational processes. The CPU 231 is an example of a processor.

The memory 241 is a storage device that stores a program, data, etc. used by the computation node device 201-1. The memory 241 is for example a Random Access Memory (RAM).

Note that the router unit 211-*j* and the network interface unit 221 may be provided outside the computation node device 201-1.

The computation node devices 201-2 through 201-9 have a configuration similar to that of the computation node device 201-1, and thus will not be explained.

Figure 5:
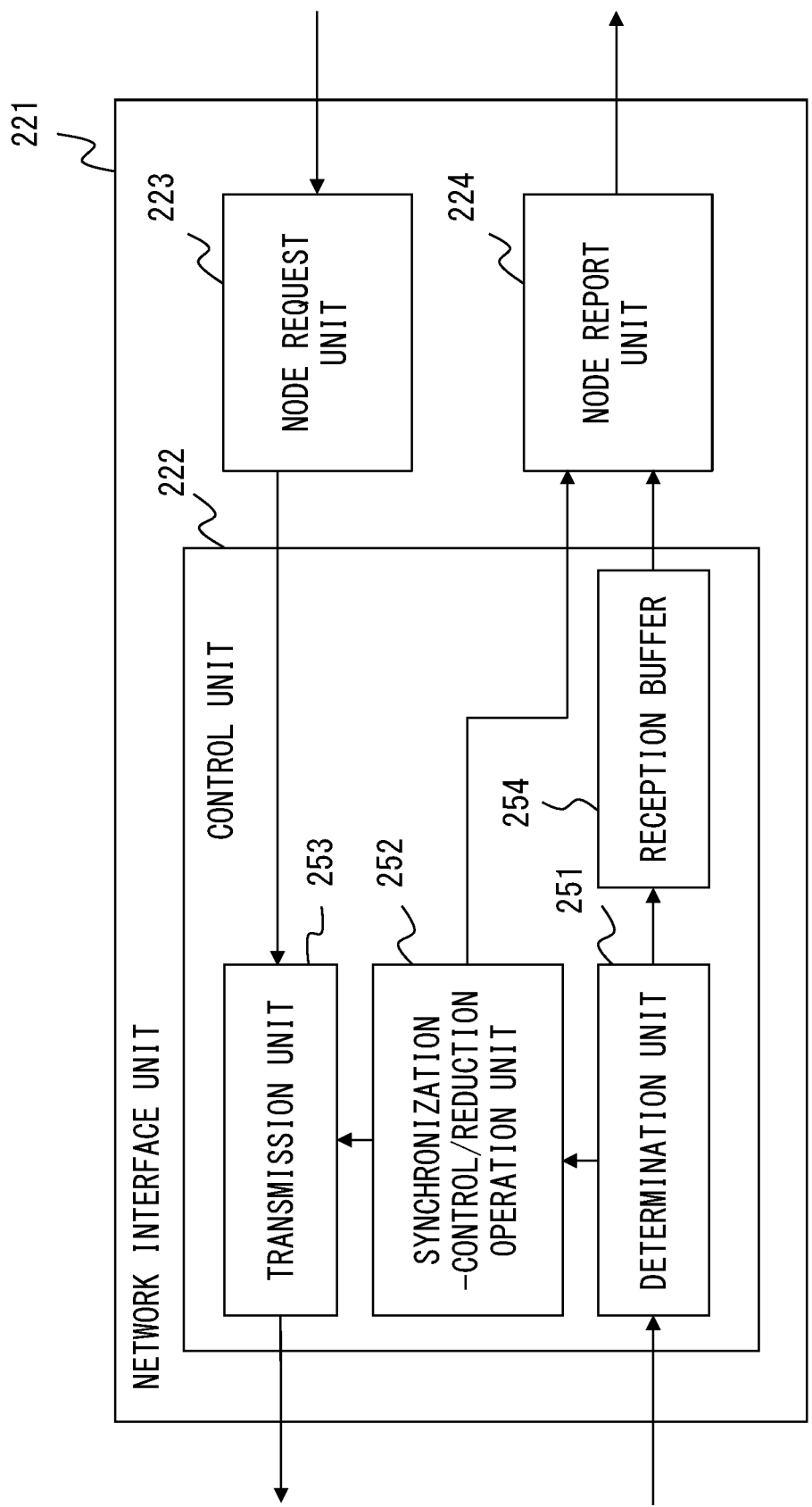
FIG. 5 illustrates a configuration of a network interface unit according to an embodiment.

FIG. 5 illustrates a configuration of the network interface unit according to the embodiment.

The network interface unit 221 includes the control unit 222, the node request unit 223, and the node report unit 224.

The control unit 222 includes a determination unit 251, a synchronization-control/reduction operation unit 252, a transmission unit 253, and a reception buffer 254.

While receiving a packet, the determination unit 251 determines the process to be performed for the packet and the transmission destination of the packet on the basis of the control information of the received packet, and outputs an already-received portion of the packet to the synchronization-control/reduction operation unit 252 or the reception buffer 254. When the control information of the received packet indicates a reduction operation, the determination unit 251 determines that the transmission destination of the packet is the synchronization-control/reduction operation unit 252 and that a reduction operation is to be performed by using that packet.

When the control information of the received packet indicates a reduction operation, i.e., when the received packet includes data to be treated by a reduction operation, the determination unit 251 starts outputting that packet to the synchronization-control/reduction operation unit 252 before receiving the check result of the error check of that packet. In other words, the determination unit 251 outputs an already-received portion of a packet to the synchronization-control/reduction operation unit 252 before completing the reception of that packet in its entirety.

The determination unit 251, when determining the transmission destination of the packet to be the CPU 231, outputs the packet to the reception buffer 254 so as to store it.

The synchronization-control/reduction operation unit 252 controls barrier synchronization and performs a reduction operation. The synchronization-control/reduction operation unit 252 outputs an operation result to the transmission unit 253 or the node report unit 224. Before receiving the check result of an error check of a packet, the synchronization-control/reduction operation unit 252 starts a reduction operation that uses that packet. The CPU 231 according to the embodiment also performs an operation other than a reduction operation performed by the synchronization-control/reduction operation unit 252.

The transmission unit 253 outputs, to the router unit 211-*j*, the request received from the node request unit 223 and the operation result received from the synchronization-control/reduction operation unit 252.

The reception buffer 254 stores the packet received from the determination unit 251.

The node request unit 223 outputs a request made by the CPU 231 to the transmission unit 253.

When the check result of the packet performed by the packet check unit 213 represents "no error existing", the node report unit 224 outputs, to the CPU 231, the packet stored in the reception buffer 254. The node report unit 224 also outputs, to the CPU 231, the operation result received from the synchronization-control/reduction operation unit 252.

Figure 6:
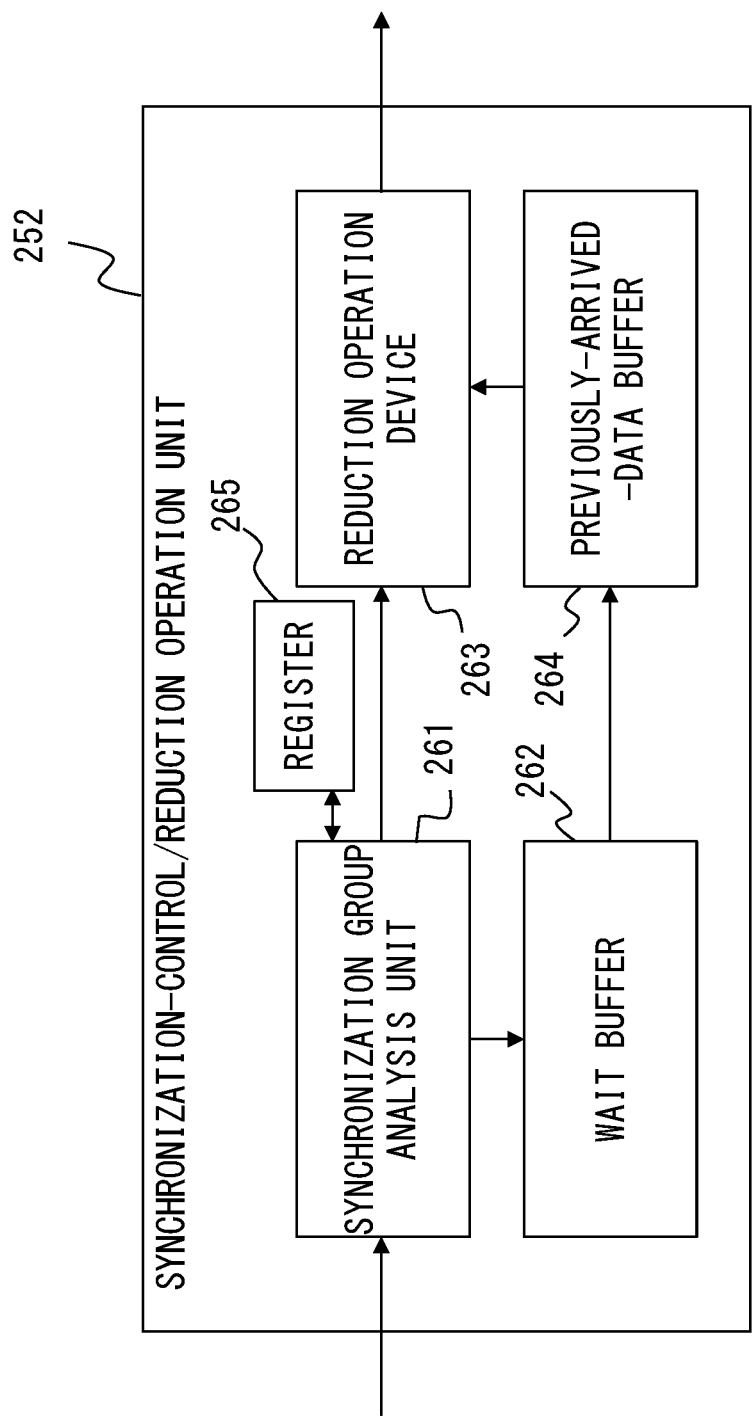
FIG. 6 illustrates a configuration of a synchronization-control/reduction operation unit according to an embodiment.

FIG. 6 illustrates a configuration of the synchronization-control/reduction operation unit according to the embodiment.

The synchronization-control/reduction operation unit 252 includes a synchronization group analysis unit 261, a wait buffer 262, a reduction operation device 263, a previously arrived data buffer 264, and a register 265.

The synchronization group analysis unit 261 searches for a group of barrier synchronization and a reduction pair.

The wait buffer 262 is a storage device that stores a packet received when no previously arrived data exists.

The reduction operation device 263 performs a reduction operation by using a packet stored in the previously arrived data buffer 264 and a received packet, and outputs the operation result.

The previously arrived data buffer 264 is a storage device that stores a packet when the check result of that packet represents "no error existing".

The register 265 stores information representing a group of barrier synchronization and a reduction pair, information representing the presence or absence of previously arrived data used for a reduction operation, and other types of information.

Figure 7:
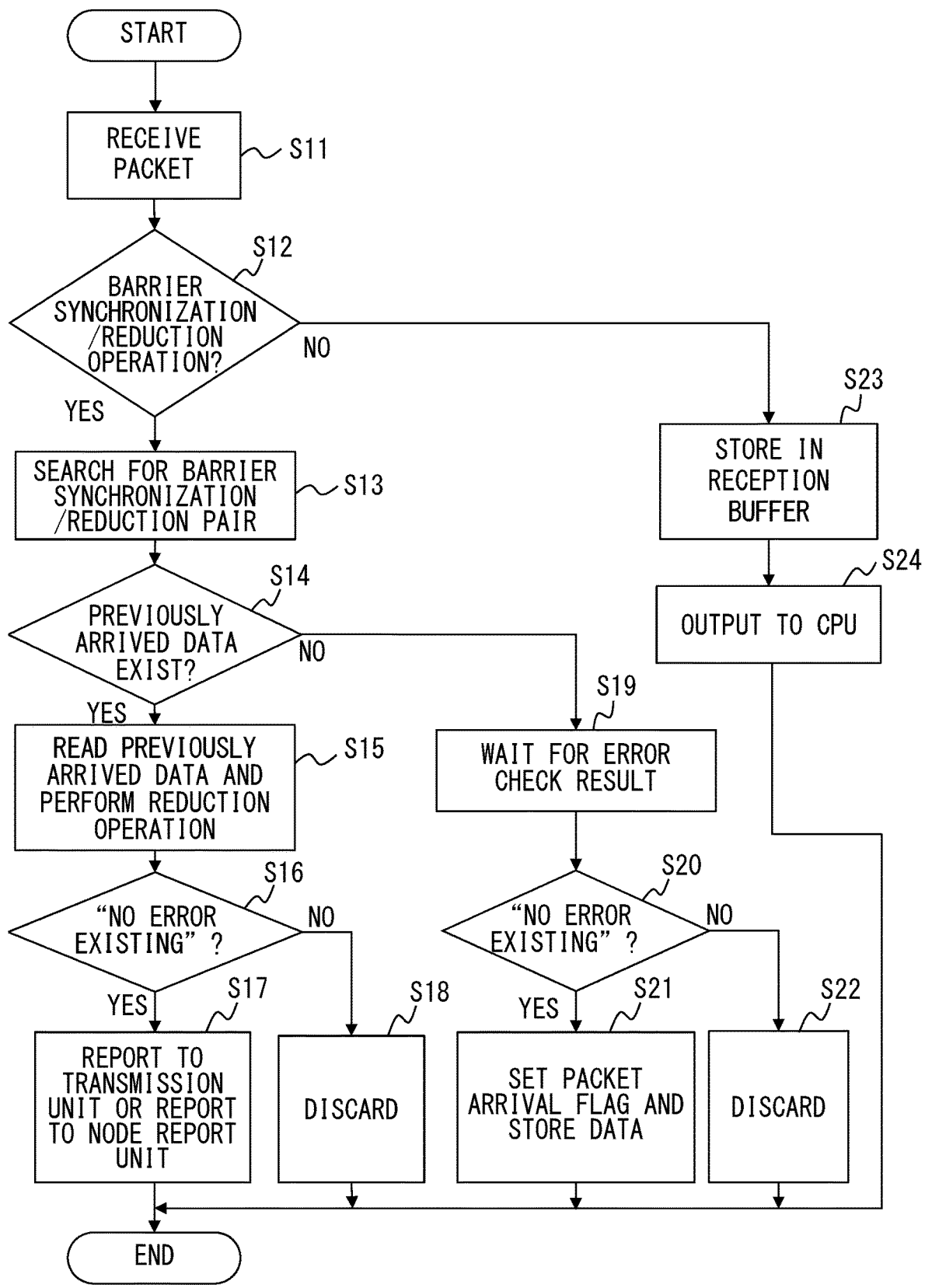
FIG. 7 illustrates a flowchart of a control process of a network interface unit according to an embodiment.

FIG. 7 illustrates a flowchart of a control process of the network interface unit according to the embodiment.

It is assumed in this example that the reception unit 212 receives a packet from the computation node device 201-2 and the routing unit 214 outputs the packet to the control unit 222 while the packet check unit 213 is performing an error check of the packet. Explanations will be given for a reduction operation that uses a packet belonging to each of two processes. Also, repeating barrier synchronization/reduction operation of two processes makes it possible to achieve the synchronization of three or more processes. As described above, the packet check unit 213 describes the result of the error check of the packet to the flag at the tail of the packet. The embodiments are treating a reduction operation, and thus barrier synchronization will not be explained.

In step S11, the determination unit 251 receives a packet from the routing unit 214.

In step S12, the determination unit 251 determines a process for the packet and the transmission destination on the basis of the control information of the packet. When the control information of the received packet represents barrier synchronization and a reduction operation, the determination unit 251 determines that barrier synchronization and a reduction operation are to be performed by using the received packet and that the transmission destination is the synchronization-control/reduction operation unit 252. When it is determined that barrier synchronization and a reduction operation are to be performed by using the received packet, the determination unit 251 starts outputting the packet to the synchronization-control/reduction operation unit 252 before receiving the check result of an error check of the packet. When it is determined that barrier synchronization and a reduction operation are to be performed by using the received packet, the received packet includes reduction target data belonging to one of the computation node devices 201-2 through 201-9. When it is not determined that barrier synchronization and a reduction operation are to be performed by using the received packet, the determination unit 251 outputs that packet to the reception buffer 254 so as to store it before receiving the check result of an error check of the packet. When it is determined that barrier synchronization and a reduction operation are to be performed by using the received packet, the control proceeds to step S13, whereas when it is not determined that barrier synchronization and a reduction operation are to be performed by using the received packet, the control proceeds to step S23.

In step S13, the synchronization group analysis unit 261 receives the packet from the determination unit 251, and searches, on the basis of the control information of the received packet and information in the register 265, for the group of barrier synchronization and a reduction pair for which the received packet is treated. The reduction pair is previously arrived data used in the reduction operation together with the received packet.

In step S14, the synchronization group analysis unit 261 determines whether the previously arrived data (i.e. reduction pair) used in the reduction operation together with the received packet exists in the previously arrived data buffer 264. The register 265 stores information representing the presence or absence of previously arrived data. When previously arrived data exists, the control proceeds to step S15, and when previously arrived data does not exist, the control proceeds to step S19.

In step S15, the synchronization group analysis unit 261 outputs the received packet to the reduction operation device 263. The reduction operation device 263 reads the previously arrived data from the previously arrived data buffer 264, and performs a reduction operation by using the received packet and the previously arrived data.

In step S16, the synchronization group analysis unit 261 receives the check result of an error check of the packet so as to refer to the check result, and when the check result represents "no error existing", the control proceeds to step S17, and when the check result represents "error existing", the control proceeds to step S18.

In step S17, the synchronization group analysis unit 261 outputs the check result to the reduction operation device 263, and the reduction operation device 263 outputs the operation result of the reduction operation to the transmission unit 253 or the node report unit 224 because the check result represents "no error existing".

In step S18, the synchronization group analysis unit 261 instructs the reduction operation device 263 to discard the operation result. When receiving the instruction, the reduction operation device 263 discards the operation result. In other words, the reduction operation device 263 does not output the operation result.

The synchronization group analysis unit 261 in step S19 stores, in the wait buffer 262, data k included in the received packet, and waits for the reception of the check result of an error check, i.e., the reception of the flag at the tail of the packet.

In step S20, the synchronization group analysis unit 261 receives the check result of an error check of the packet so as to refer to the check result, and when the check result represents "no error existing", the control proceeds to step S21, and when the check result represents "error existing", the control proceeds to step S22.

In step S21, the synchronization group analysis unit 261 describes the existence of previously arrived data to information (flag) representing the presence or absence of previously arrived data in the register 265 corresponding to the received packet. The synchronization group analysis unit 261 stores, in the previously-arrived-data buffer 264, data k included in the packet stored in the wait buffer 262. Data k stored in the previously-arrived-data buffer 264 is used as previously arrived data.

In step S22, the synchronization group analysis unit 261 discards the packet stored in the wait buffer 262.

In step S23, the determination unit 251 stores the received packet in the reception buffer 254.

In step S24, the node report unit 224 reads the packet from the reception buffer 254 and outputs the packet to the CPU 231 when the result of the check by the packet check unit 213 represents "no error existing". When the result of the check by the packet check unit 213 represents "error existing", the determination unit 251 discards the packet in the reception buffer 254.

Figure 8:
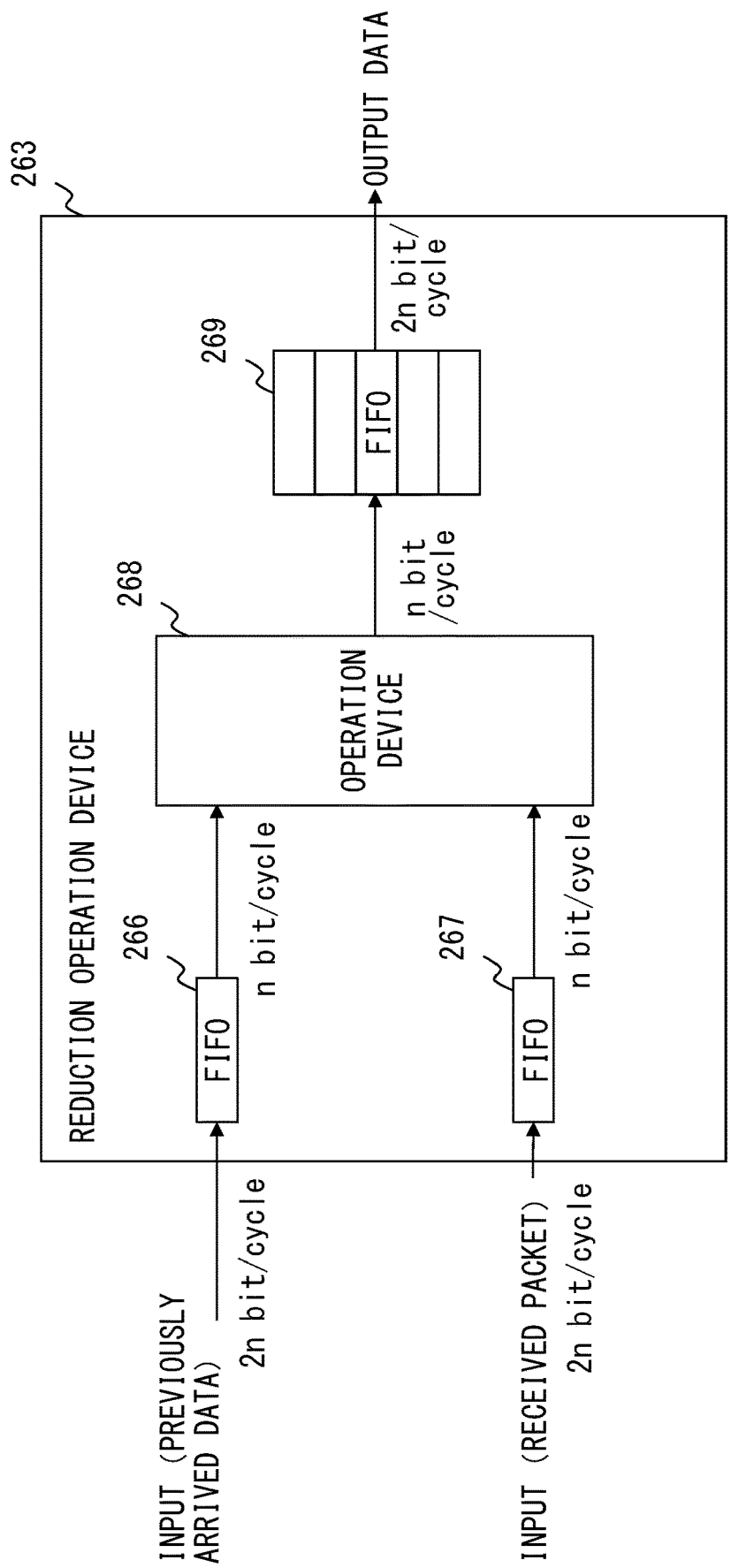
FIG. 8 illustrates a process performed by a reduction operation device according to an embodiment.

FIG. 8 illustrates a process performed by the reduction operation device according to the embodiment.

The reduction operation device 263 includes First-In First-Out (FIFO) memories 266, 267, and 269, and an operation device 268.

The FIFO memory 266 stores previously arrived data input from the previously-arrived-data buffer 264, and outputs the data to the operation device 268. The throughput of previously arrived data input to the FIFO memory 266 is 2n bits/cycle. The throughput of output data of the FIFO memory 266 is n bits/cycle.

The FIFO memory 267 stores a received packet input from the synchronization group analysis unit 261, and outputs it to the operation device 268. The throughput of packets input to the FIFO memory 267 is 2n bits/cycle. The throughput of output data of the FIFO memory 267 is n bits/cycle.

The operation device 268 performs an operation by using previously arrived data and a received packet, and outputs the operation result to the FIFO memory 269. The throughput of an operational process performed by the operation device 268 is n bits/cycle.

The FIFO memory 269 stores the operation result input from the operation device 268, and outputs the operation result as output data. The throughput between the operation device 268 and the FIFO memory 269 is n bits/cycle. The throughput of output data of the FIFO memory 269 is 2n bits/cycle.

In many cases, a reduction operation using a packet with a short packet length is used less frequently, and a high throughput is not needed. Accordingly, abundant computational resources are not allocated to the operation device 268. Accordingly, the operation device 268 in FIG. 8 has an operational processing ability equivalent to half the throughput of packets to the reduction operation device 263.

FIG. 9 illustrates a time chart of input and output for the reduction operation device according to the embodiment.

FIG. 9 illustrates a time chart for a case where a packet in the format illustrated in FIG. 2 was processed by using the reduction operation device 263 illustrated in FIG. 8. It is assumed in this example that each piece of data k included in the packet is n bits in size. It is also assumed that previously arrived data includes data k', and each piece of data k' is n bits in size.

The time chart illustrated in FIG. 9 illustrates, sequentially from the top, cycle number, reception packet input to the reduction operation device 263, previously arrived data input to the reduction operation device 263, output of the operation device 268, and output of the reduction operation device 263.

In cycle 0, the routing header of a reception packet is input to the FIFO memory 266.

In cycle 1, the control information of the reception packet is input to the reduction operation device 263.

In cycle 2, data 1 and data 2 of the received packet are input to the reduction operation device 263. Also, data 1' and data 2' of the previously arrived data are input to the reduction operation device 263.

In cycle 3, data 3 and data 4 of the received packet are input to the reduction operation device 263. Also, data 3' and data 4' of the previously arrived data are input to the reduction operation device 263. The operation device 268 outputs data 1", which is the operation result of data 1 and data 1'.

In cycle 4, data 5 and data 6 of the received packet are input to the reduction operation device 263. Also, data 5' and data 6' of the previously arrived data are input to the reduction operation device 263. The operation device 268 outputs data 2", which is the operation result of data 2 and data 2'.

In cycle 5, data 7 and data 8 of the received packet are input to the reduction operation device 263. Also, data 7' and 8' of the previously arrived data are input to the reduction operation device 263. The operation device 268 outputs data 3", which is the operation result of data 3 data 3'.

In cycle 6, a flag (F) representing the check result of an error check of the received packet is input to the reduction operation device 263. The operation device 268 outputs data 4", which is the operation result of data 4 and data 4'. In cycle 6, the flag representing the check result of an error check of the received packet reached the reduction operation device 263 as described above. The reduction operation device 263 has not output the operation result of the reduction operation in or before cycle 6, and thus, the operation result can be discarded without outputting the operation result from the reduction operation device 263 when the check result represents "error existing". Hereinafter, it is assumed that the check result represents "no error existing".

In cycle 7, the operation device 268 outputs data 5", which is the operation result of data 5 and data 5'. The reduction operation device 263 outputs the control information.

In cycle 8, the operation device 268 outputs data 6", which is the operation result of data 6 and data 6'. The reduction operation device 263 outputs data 1" and data 2".

In cycle 9, the operation device 268 outputs data 7", which is the operation result of data 7 and data 7'. The reduction operation device 263 outputs data 3" and data 4".

In cycle 10, the operation device 268 outputs data 8", which is the operation result of data 8 and data 8'. The reduction operation device 263 outputs data 5" and data 6".

In cycle 11, the reduction operation device 263 outputs data 7" and data 8".

According to the computation node device of the embodiment, a reduction operation using a received packet starts before receiving the result of an error check of that packet, making it possible to reduce a waiting time between the reception of the packet and the start of the reduction operation.

All examples and conditional language provided herein are intended for pedagogical purposes to aiding the reader in understanding the invention and the concepts contributed by the inventor to further the art, and are not to be construed as being limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A computation node device comprising:
   a buffer configured to store first data;
   a receiver configured to receive a packet including second data;
   an error check circuit configured to perform an error check of the packet and output a check result; and
   an operation device configured to perform, before receiving the check result output from the error check circuit, a reduction operation by using the first data stored in the buffer and the second data included in the packet and output an operation result of the reduction operation when the check result output from the error check circuit indicates non-existence of an error in the packet.

2. The computation node device according to claim 1, wherein
   the operation device discards the operation result when the check result indicates existence of an error in the packet.

3. The computation node device according to claim 1, wherein
   the buffer stores the second data when the first data is not stored in the buffer and the check result indicates non-existence of an error in the packet.

4. A parallel computer system including a plurality of computation node devices, wherein
   each of the plurality of computation node devices includes:
   a buffer configured to store first data;
   a receiver configured to receive a packet that includes second data from a different computation node device;
   an error check circuit configured to perform an error check of the packet and output a check result; and
   an operation device configured to perform, before receiving the check result output from the error check circuit, an operation by using first data stored in the buffer and second data included in the packet and output an operation result of the performed operation when the check result indicates non-existence of an error in the received packet.

5. The parallel computer system according to claim 4, wherein
   the operation device discards the operation result when the check result indicates existence of an error in the packet.

6. The parallel computer system according to claim 4, wherein
   the buffer stores the second data when the first data is not stored in the buffer and the check result indicates non-existence of an error in the packet.

7. A control method for a computation node device that includes a buffer configured to store first data, a receiver, an error check circuit, and an operation device, the control method comprising:
   receiving, by the receiver, a packet including second data;
   performing, by the error check circuit, an error check of the packet to output a check result;
   performing, by the operation device and before receiving the check result output from the error check circuit, an operation by using first data stored in the buffer and second data included in the packet; and
   outputting, by the operation device, an operation result of the performed operation when the check result indicates non-existence of an error in the received packet.

8. The control method according to claim 7, wherein
   the operation device discards the operation result when the check result indicates existence of an error in the packet.

9. The control method according to claim 7, wherein
   the buffer stores the second data when the first data is not stored in the buffer and the check result indicates non-existence of an error in the packet.

* * * * *